(12) United States Patent
Smit et al.

(10) Patent No.: US 10,620,014 B2
(45) Date of Patent: Apr. 14, 2020

(54) ENCODER SYSTEM FOR POSITION DETERMINATION WITH VARYING SCALE

(71) Applicant: Rockwell Automation Technologies, Inc., Mayfield Heights, OH (US)

(72) Inventors: Peter M. Smit, Mount Sinai, NY (US); Xikai Sun, Shanghai (CN); Jadav Das, Lake Grove, NY (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 139 days.

(21) Appl. No.: 15/992,935

(22) Filed: May 30, 2018

(65) Prior Publication Data

US 2019/0368895 A1 Dec. 5, 2019

(51) Int. Cl.
| | |
|---|---|
| G01B 7/14 | (2006.01) |
| G01B 7/30 | (2006.01) |
| G01R 33/06 | (2006.01) |
| H01L 43/06 | (2006.01) |
| G01D 5/14 | (2006.01) |
| G01D 5/12 | (2006.01) |
| G01D 11/24 | (2006.01) |
| G01R 33/07 | (2006.01) |
| G01R 33/09 | (2006.01) |
| G01R 33/00 | (2006.01) |

(52) U.S. Cl.
CPC ............... G01D 5/14 (2013.01); G01D 5/12 (2013.01); G01D 5/142 (2013.01); G01D 5/145 (2013.01); G01D 11/245 (2013.01); G01R 33/07 (2013.01); G01R 33/072 (2013.01); G01R 33/077 (2013.01); *G01R 33/0052* (2013.01); *G01R 33/09* (2013.01)

(58) Field of Classification Search
CPC ...... G01D 5/145; G01D 5/142; G01D 11/245; G01D 5/12; G01R 33/07; G01R 33/077; G01R 33/072; G01R 33/09; G01R 33/0052
USPC ....... 324/51, 55, 200, 207.11, 207.13, 207.2, 324/251
See application file for complete search history.

(56) References Cited

U.S. PATENT DOCUMENTS

2017/0292855 A1* 10/2017 Kaste ..................... G01D 5/142
2018/0216967 A1* 8/2018 Sun ....................... G01D 5/2046
2018/0216968 A1* 8/2018 Sun ....................... G01D 5/2086

* cited by examiner

*Primary Examiner* — Raul J Rios Russo
(74) *Attorney, Agent, or Firm* — Boyle Fredrickson S.C.

(57) ABSTRACT

By configuring an encoder scale as a varying scale with successively increasing or decreasing pitch, sensors in a travel path of the scale can detect a phase difference to determine an absolute position of the scale for use in an industrial control system. Due to the successively increasing or decreasing pitch, each sensor can detect successively increasing or decreasing properties (such as magnetic fields) from the scale in a uniquely identifiable pattern. By taking the difference between readings of adjacent sensors, each sensor detecting properties of the scale, an absolute position of the scale between the sensors can be determined. The principle for feedback for the encoder system is analogous to a Nonius or Vernier principle to determine absolute position.

20 Claims, 7 Drawing Sheets

ENCODER SYSTEM FOR POSITION DETERMINATION WITH VARYING SCALE

FIELD OF THE INVENTION

The subject matter disclosed herein relates generally to industrial control systems, and more particularly, to an improved encoder system for position determination in an industrial control system.

BACKGROUND OF THE INVENTION

In industrial control systems, it is often desirable to move objects from one location to another for accomplishing various tasks. For example, rolling conveyors are often used to move objects from one location to another for interacting with different machines of an industrial control process, such as a first machine at a first location for placing a box, a second machine at a second location for filling the box, and a third machine at a third location for closing the box.

More recently, a track system has been developed in which multiple "carts" can be independently driven along a "track" for accomplishing the various tasks of the industrial control process. By providing independently controllable carts, the timing of each task can be more precisely controlled than traditional systems such as rolling conveyors.

In such track systems having moving carts, it is often desirable to know the position of each cart at all times, including during power-up, to ensure that the industrial control process is executing correctly. To accomplish this, each cart can be configured with an encoder scale, such as a magnetic scale, and the track can be configured with arrays of sensors, such as magnetic sensors, with an air gap between the encoder scale and the sensors. In operation, when an encoder scale on a moving cart is near a group of sensors on the track, the sensors can determine the absolute position of the cart by measuring the varying magnetic field strength or varying magnetic field angle from the magnetic encoder scale on the cart. Conversely, when the cart is away from the group of magnetic sensors on the track, the magnetic sensors no longer sense the position magnet of the cart and, in turn, no longer generate output signals having measureable amplitudes. Accordingly, the magnetic sensors can be used to determine absolute positions of carts on the track. It is desirable to improve the aforementioned feedback system.

SUMMARY OF THE INVENTION

By configuring an encoder scale as a varying scale with successively increasing or decreasing pitch, sensors in a travel path of the scale can detect a phase difference to determine an absolute position of the scale for use in an industrial control system. Due to the successively increasing or decreasing pitch, each sensor can detect successively increasing or decreasing properties (such as magnetic fields) from the scale in a uniquely identifiable pattern. By taking the difference between readings of adjacent sensors, each sensor detecting properties of the scale, an absolute position of the scale between the sensors can be determined.

As used herein, determination of an "absolute" position refers to determining position information for a moving element in a system despite power being removed. Accordingly, with absolute encoders, the position of the encoder (for providing the position of the moving element) is available immediately upon applying power. Absolute position determination and absolute encoders are distinct from "incremental" position determination and incremental encoders as known in the art.

The principle for feedback for the encoder system is analogous to a Nonius or Vernier principle to determine absolute position. A Vernier scale is a visual aid that allows a user to measure more precisely than could be done unaided when reading a uniformly divided straight or circular measurement scale. The Vernier scale is a subsidiary scale that indicates where a measurement lies in between two of the graduations of a main scale. In this way, the encoder system is like a Vernier scale by using a phase difference between two sensor angles to determine an absolute position on a single track scale.

In one aspect, a single track absolute encoder scale could comprise a 40 millimeter long element of a mover with gradually increasing or decreasing magnet lengths. A phase difference between two magnetic field sensors, such as Anisotropic Magnetoresistance (AMR) sensors, Tunnel Magneto Resistance (TMR) sensors and/or Hall effect sensors, spaced 20 millimeters apart can be used to determine the absolute position of the mover. Accordingly, sensor spacing can set a maximum encoder travel length, such as 20 millimeters in this case. For example, the encoder scale could have seven magnets totaling 40 millimeters in length, including: a first magnet that is 7.4 millimeters long; a second magnet that is 6.6 millimeters long; a third magnet that is 6.0 millimeters long; a fourth magnet that is 5.5 millimeters long; a fifth magnet that is 5.1 millimeters long; a sixth magnet that is 4.8 millimeters long; and a seventh magnet that is 4.6 millimeters long. An absolute rotary encoder version could comprise, for example, a six magnet, variable-pitch rotary magnetic encoder scale with 4,000 counts per 180° degrees, an air gap between magnetic sensors and an encoder scale of about 5 millimeters. Accordingly, the present invention may provide a low cost absolute encoder including a single increasing or decreasing (1× to 2×) pitch encoder scale that is twice the travel distance long, and an encoder read head including two sets of analog sensors placed at half the travel distance apart.

In one aspect, the magnets can be permanent magnets made from a ferromagnetic material that is magnetized to create its own persistent magnetic field. The magnets could be, for example, bonded magnets.

Specifically then, one aspect of the present invention can provide an encoder system for position determination, including: an encoder scale having multiple magnets arranged adjacently to one another, in which a magnetic pole pair including a north pole and a south pole of each magnet is arranged oppositely to a magnetic pole pair including a north pole and a south pole of an adjacent magnet so that the north pole of a magnet is adjacent to the south pole of a neighboring magnet and the south pole of the magnet is adjacent to the north pole of the neighboring magnet; and multiple sensors arranged along a path, each sensor being configured to detect a magnetic field produced from the encoder scale across a gap when the encoder scale is proximal to the sensor, in which the encoder scale and the sensors are configured to move with respect to one another in a direction, and in which magnets of the encoder scale successively increase or decrease in size with a first magnet of the plurality of magnets being largest and a last magnet of the plurality of magnets being smallest. In other aspects, optical, capacitive or inductive scales could be used.

These and other objects, advantages and aspects of the invention will become apparent from the following description. The particular objects and advantages described herein can apply to only some embodiments falling within the claims and thus do not define the scope of the invention. In the description, reference is made to the accompanying drawings which form a part hereof, and in which there is shown a preferred embodiment of the invention. Such embodiment does not necessarily represent the full scope of the invention and reference is made, therefore, to the claims herein for interpreting the scope of the invention.

BRIEF DESCRIPTION OF THE DRAWINGS

Preferred exemplary embodiments of the invention are illustrated in the accompanying drawings in which like reference numerals represent like parts throughout, and in which.

DETAILED DESCRIPTION OF THE OF THE INVENTION

Figure 1:
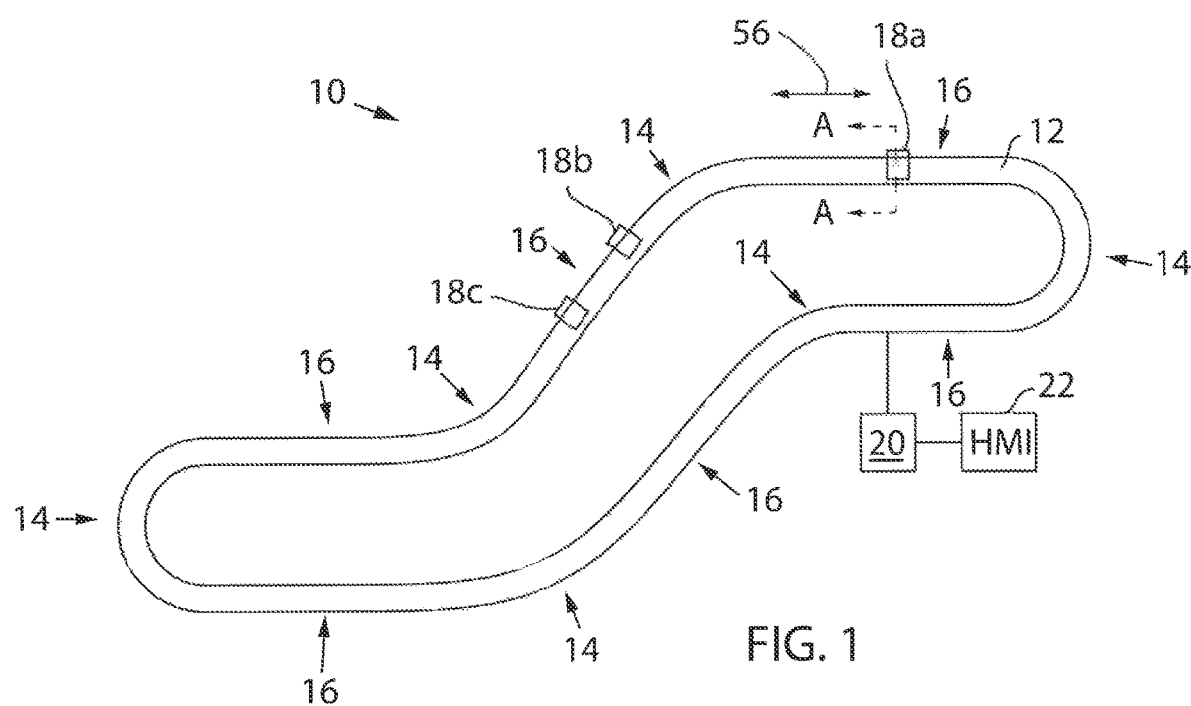
FIG. 1 is an exemplar industrial control system including a track having curved and linear sections and multiple carts for moving objects along the track in accordance with an aspect of the invention.

Referring now to FIG. 1, in accordance with an aspect of the invention, an exemplar industrial control system 10 includes a track 12 having curved sections 14 and linear sections 16. Multiple carts 18, such as carts 18a, 18b and 18c, can be provided for moving objects along the track 12 from one location to another for accomplishing various tasks in the industrial control system 10. The track 12 can be connected to a controller 20, which can include a processor executing a program stored in a non-transient medium, and which can communicate with a Human Machine Interface ("HMI") 22 for providing I/O, for carrying out various aspects of the invention as will be described herein. It will be appreciated that the track 12, being flexibly capable of curved and linear sections according to various geometries, can be configured to implement a wide variety of paths and orientations as may be required in the environment.

Figure 2:
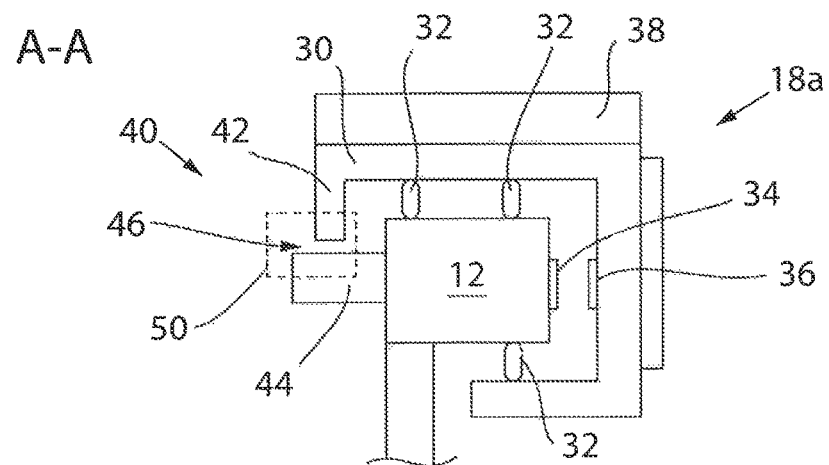
FIG. 2 is a cross sectional view of a cart along the track taken along line A-A of FIG. 1.

With additional reference to FIG. 2, a cross sectional view of a cart 18 along the track 12, such as the cart 18a, taken along line A-A of FIG. 1, illustrates certain aspects of the system. The cart 18 can include a frame 30, which may be aluminum, supporting one or more rollers 32 in communication with the track 12 for moving the cart 18 along the track 12. To move the cart 18, a power winding 34 disposed along the track 12 can be selectively energized to electromagnetically react with a power magnet 36 affixed to the cart 18 to thereby move the cart 18. The cart 18 can include a work area 38 which can be used to accomplish various industrial control functions for moving objects. For determining a position of the cart 18 along the track 12, the system can implement an encoder system 40 including a mover portion 42 which may be part of the cart 18 and a stationary portion 44 provided along the track 12. The mover portion 42 can be arranged to continuously face the stationary portion 44 across a gap 46, which could be preferably a 3 millimeter air gap, as the cart 18 moves along the track 12.

Figure 3A:
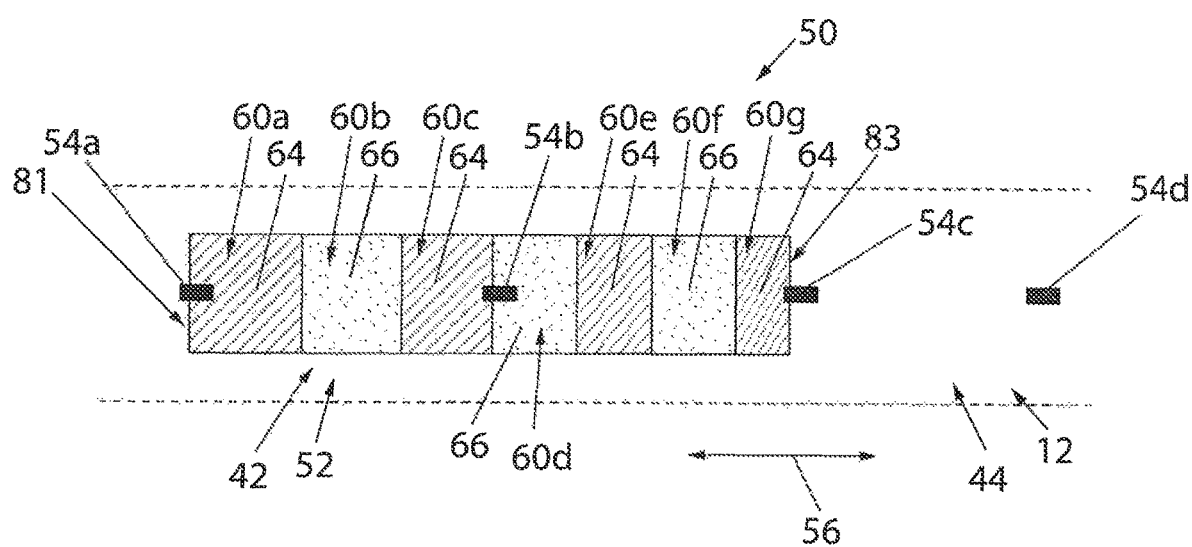
FIG. 3A is a detailed plan view of an encoder system for absolute position determination which could be used in the industrial control system of FIG. 1.
Figure 3B:
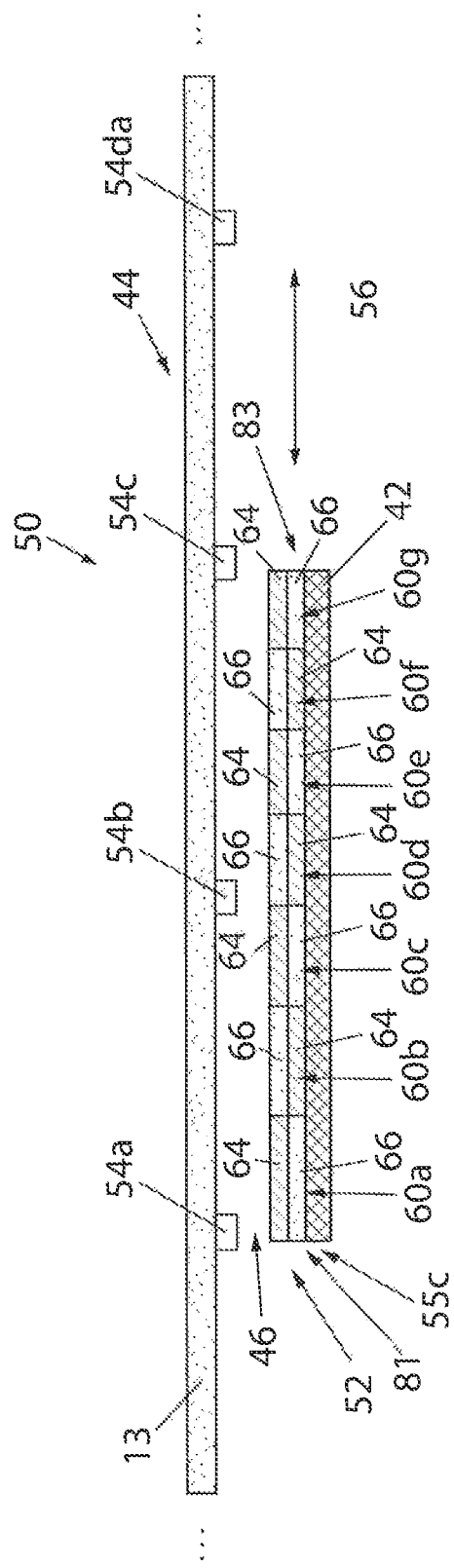
FIG. 3B is a detailed side view of the encoder system of FIG. 3A.

With additional reference to FIGS. 3A and 3B, detailed plan and side views of area 50, respectively, of the mover portion 42 facing the stationary portion 44 across the gap 46 is provided according to an aspect of the invention. The encoder system 40 for position determination can include an encoder scale 52 and multiple sensors 54, such as sensors 54a, 54b and 54c, each sensor having a unique identification corresponding to a relative position in the system. The encoder scale 52 can be attached to the mover portion 42. The sensors 54 can be attached the stationary portion 44, such as via surface mounting to a Printed Circuit Board (PCB) 13, along the track 12, forming a path. The sensors 54 are preferably evenly spaced apart along the path. In one aspect, the encoder scale 52 can comprise a rectangular plate that is 25 millimeters long on a longer first side 55a, which is generally disposed in a direction of travel 56, 10 millimeters wide on a shorter second side 55b, which is generally transverse to the direction of travel 56, and about 1 millimeter thick on a third side 55c, which is perpendicular to the direction of travel 56. The sensors 54 can be spaced apart along the path, for example, by 20 millimeters, in the direction of travel 56.

The encoder scale 52 can include multiple magnets 60 arranged adjacently to one another, such as magnets 60a, 60b, 60c, 60d, 60e, 60f and 60g. The magnets can be permanent magnets made from a ferromagnetic material that is magnetized to create its own persistent magnetic field. The magnets could be, for example, bonded magnets. Each of the magnets 60 can comprise a magnetic pole pair between sides of the magnet for producing a magnetic field, such as a north pole 64 and a south pole 66 for each magnet, with one pole facing toward the stationary portion 44, and the other pole facing away from stationary portion 44 (see FIGS. 3A and 3B). Accordingly, magnetic pole pairs of the magnets 60 can be arranged oppositely to one another so that the north pole 64 of a magnet is adjacent to the south pole 66 of a neighboring magnet and the south pole 66 of the magnet 60 is adjacent to the north pole 64 of the neighboring magnet.

For example, a north pole 64 of the first magnet 60a can be arranged adjacently to a south pole 66 of the second magnet 60b; the south pole 66 of the second magnet 60b can be arranged adjacently to a north pole 64 of the third magnet 60c; the north pole 64 of the third magnet 60c can be arranged adjacently to a south pole 66 of the fourth magnet 60d; the south pole 66 of the fourth magnet 60d can be arranged adjacently to a north pole 64 of the fifth magnet 60e; the north pole 64 of the fifth magnet 60e can be arranged adjacently to a south pole 66 of the sixth magnet 60f; and the south pole 66 of the sixth magnet 60f can be arranged adjacently to a north pole 64 of the seventh magnet 60g, each of the aforementioned poles facing toward the stationary portion 44 across the gap 46 (see FIG. 3A or 3B). Also, a south pole 66 of the first magnet 60a can be arranged adjacently to a north pole 64 of the second magnet 60b; the north pole 64 of the second magnet 60b can be arranged adjacently to a south pole 66 of the third magnet 60c; the south pole 66 of the third magnet 60c can be arranged adjacently to a north pole 64 of the fourth magnet 60d; the north pole 64 of the fourth magnet 60d can be arranged adjacently to a south pole 66 of the fifth magnet 60e; the south pole 66 of the fifth magnet 60e can be arranged adjacently to a north pole 64 of the sixth magnet 60f; and the north pole 64 of the sixth magnet 60f can be arranged adjacently to a south pole 66 of the seventh magnet 60g, each of the aforementioned poles facing away from the stationary portion 44 (see FIG. 3B).

Figure 4:
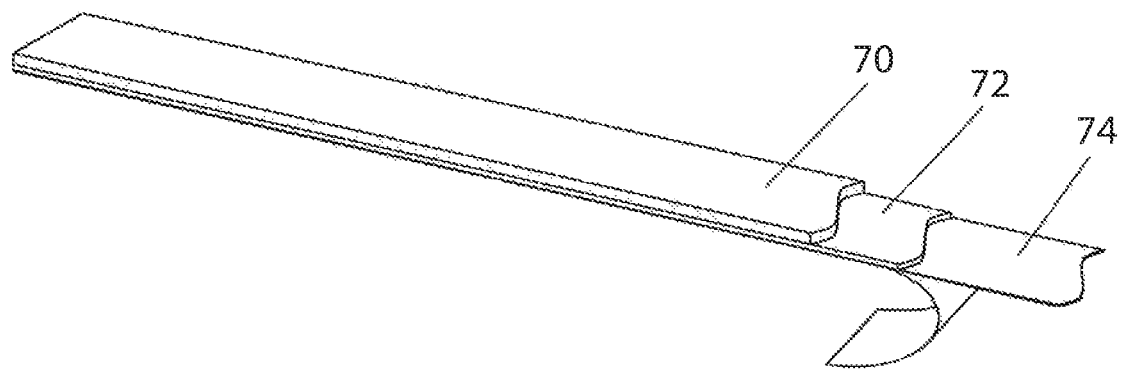
FIG. 4 is an isometric view of a section of magnetic tape which could be used in the encoder system of FIG. 3A.

With additional reference to FIG. 4, each magnet could comprise, for example, a 1 millimeter thick section of magnetic tape 70, which can be layered over a 0.3 millimeter thick stainless steel carrier tape 72, which can be layered over a 0.13 millimeter thick adhesive tape 74, which can be affixed to the mover portion 42.

The encoder scale 52 and the sensors 54 are configured to move with respect to one another in the direction of travel 56. In one aspect, such as in the industrial control system 10, the encoder scale 52 can move with the mover portion 42 along the track 12 while the sensors 54 remain stationary on the track 12. However, in other aspects, the sensors 54 can move while the encoder scale 52 remains stationary, such as when one or more sensors are on a mover portion and multiple encoder scales are on a stationary portion, or the sensors 54 and the encoder scale 52 can each be configured to move with respect to one another.

The sensors 54 can be magnetic field sensors configured to detect magnetic fields produced from the encoder scale 52 when the encoder scale 52 is proximal to the sensor 54 across the gap 46. In addition, each sensor 54 can be configured to indicate a magnetic field direction produced from the encoder scale 52. The sensors 54 could comprise, for example, Anisotropic Magnetoresistance (AMR) sensors, Tunnel Magneto Resistance (TMR) sensors and/or Hall effect sensors. The sensors 54 can be arranged on the PCB 13 (see FIG. 3B) disposed along the track 12 with sensing elements of the sensors 54 arranged perpendicularly to the PCB 13 and the direction of travel 56.

In accordance with an aspect of the invention, the magnets 60 (including the magnetic pole pairs of each) of the encoder scale 52 can successively increase or decrease in size (or pitch) with a first magnet of the multiple magnets 60 being largest and a last magnet of the multiple magnets 60 being smallest. For example, the encoder scale 52 could have seven magnets totaling 40 millimeters in length, including: the first magnet 60a that is 7.4 millimeters in length (being a largest magnet 60); the second magnet 60b that is 6.6 millimeters in length (being successively smaller than the first magnet 60a); the third magnet 60c that is 6.0 millimeters in length (being successively smaller than the second magnet 60b); the fourth magnet 60d that is 5.5 millimeters in length (being successively smaller than the third magnet 60c); the fifth magnet 60e that is 5.1 millimeters in length (being successively smaller than the fourth magnet 60d); the sixth magnet 60f that is 4.8 millimeters in length (being successively smaller than the fifth magnet 60e); and the last, seventh magnet 60g that is 4.6 millimeters in length (being a smallest magnet 60) (which may provide up to 1 micron resolution). A coarser scale (e.g., fewer magnets and/or a larger air gap) may result in lower/coarser resolution, whereas a finer scale (e.g., a smaller air gap) may result in higher/finer resolution. For example, a magnet scale varying from 3.6 to 1.8 mm, with an air gap of about 3 mm, may provide a resolution up to 0.5 microns. By configuring an encoder scale as a set of oppositely arranged, adjacent magnets 60 with successively increasing or decreasing pitch, sensors 54 in the direction of travel 56 of the encoder scale 52 can detect phase differences to determine absolute positions of the encoder scale 52 for use in an industrial control system such as the system 10. In particular, due to the successively increasing or decreasing pitch, each sensor 54 can detect successively increasing or decreasing magnetic fields from the encoder scale 52 in a uniquely identifiable pattern. A control system communicating with the sensors 54, such as the controller 20, can take the difference between readings of adjacent sensors 54 to determine an absolute position of the encoder scale 52. This principle is analogous to a Nonius or Vernier principle to determine absolute position.

Figure 5:
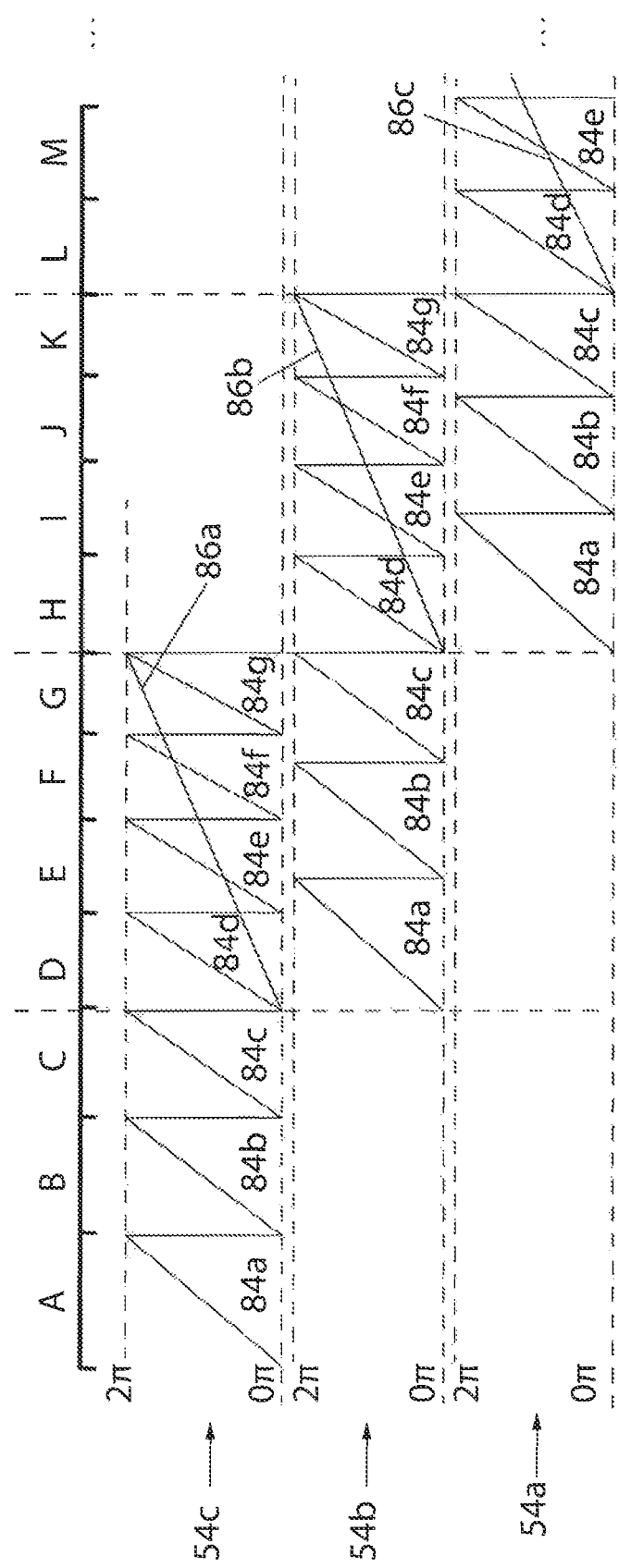
FIG. 5 is a graph illustrating profiles detected by sensors corresponding to positions of an encoder scale for absolute position determination in the encoder system of FIG. 3A.

For example, with additional reference to the diagram of FIG. 5, as the encoder scale 52 moves along the track 12 in one direction, a first end 81 of the encoder scale 52 can first encounter the third sensor 54c at a first time "A." Due to the large size of the first magnet 60a, the third sensor 54c will correspondingly detect an angle (illustrated between 0 to $2\pi$ radians) having a long profile 84a. Then, as the encoder scale 52 continues to move in the same direction, the successively smaller second magnet 60b will cause the third sensor 54c to correspondingly detect an angle having a successively smaller profile 84b at a second time "B." Then, as the encoder scale 52 continues to move in the same direction, the successively smaller third magnet 60c will cause the third sensor 54c to correspondingly detect an angle having a successively smaller profile 84c at a third time "C." Then, as the encoder scale 52 continues to move in the same direction, the successively smaller fourth magnet 60d will cause the third sensor 54c to correspondingly detect an angle having a successively smaller profile 84d at a fourth time "D." This detection pattern can continue for each of the magnets 60 of varying pitch as the encoder scale 52 moves past the third sensor 54c from the first end 81 through the second end 83.

However, with the sensors 54 being spaced apart by a fixed distance, such as 20 millimeters, and with the length of the encoder scale in the direction of the path being at least twice the fixed distance, such as 40 millimeters, at least two neighboring sensors 54 can detect the encoder scale 52 with different patterns at any given time. For example, when the third sensor 54c correspondingly detects the angle having the profile 84d at the fourth time "D," the second sensor 54b can correspondingly detect an angle having a long profile 84a, caused by the large size of the first magnet 60a, spanning the fourth time "D" and a fifth time "E." Then, when the third sensor 54c correspondingly detects the angle having the profile 84e at the fifth time "E," the second sensor 54b can correspondingly detect an angle having a successively smaller profile 84b, caused by the successively smaller size of the second magnet 60b, spanning the fifth time "E" and a sixth time "F." This detection pattern can continue for each of the magnets 60 of varying pitch as the encoder scale 52 moves past the second and third sensor 54b and 54c, respectively. Analogous to a Nonius or Vernier scale, a control system communicating with the sensors 54, such as the controller 20, can thereby determine an absolute position 86 of the encoder scale 52 by calculating a phase difference between neighboring sensors, such as a first absolute position 86a of the encoder scale 52 taken by calculating a phase difference between the second and third sensor 54b and 54c, respectively, beginning at the fourth time "D." Moreover, the control system can thereby determine additional characteristics with respect to the encoder scale 52 and the attached mover portion 42, such as direction, velocity, acceleration, and the like, based on the sensed measurements.

It should be appreciated that many variations of the invention can be implemented for achieving various encoder systems. For example, although the encoder scale 52 is illustrated as having seven magnets by way of example, it should be appreciated that greater or fewer magnets 60 can be used within the scope of the invention. Also, it should be appreciated that many variations of the invention can not only be implemented for straight and/or curve sections for independent cart systems, but also for low cost short stroke linear encoder systems with absolute position determination and/or low cost, 180 degree rotary encoder systems with absolute position determination. Moreover, with additional gears, a second encoder scale could be added to count revolutions for implementing a multi-turn encoder system.

Figure 6:
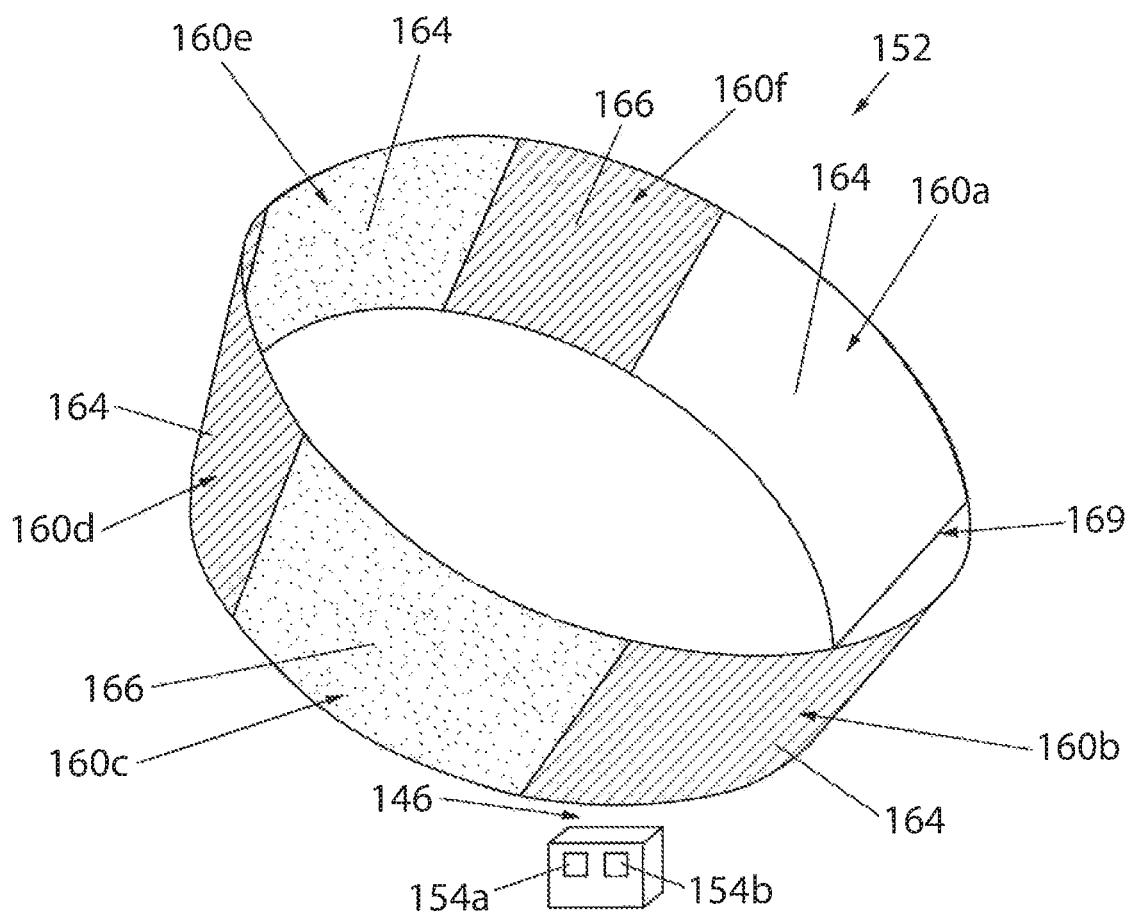
FIG. 6 is an isometric view of a rotary encoder system for absolute position determination in accordance with an aspect of the invention.

Referring now to FIG. 6, in another aspect of the invention, a rotary encoder system for position determination can include an encoder scale 152 and sensors 154, such as sensors 154a and 154b. The encoder scale 152 can be attached to a rotating portion, such as a drive shaft, while two or more sensors 154 (placed half the scale length apart or 180 degrees apart for rotary encoders) can be attached to a stationary portion, arranged proximal to the encoder scale 152 across a gap 146, which could be an air gap. The encoder scale 152 can include multiple magnets 160 arranged adjacently to one another in a ring, such as magnets 160a, 160b, 160c, 160d, 160e and 160f. The magnets can be permanent magnets, such as bonded magnets, and could comprise sections of magnetic tape 70 (see FIG. 4). Each of the magnets 160 can comprise a magnetic pole pair between inner and outer sides of the magnet for producing a magnetic field, such as a north pole 164 and a south pole 166 for each magnet, with one pole facing an outer side of the ring, toward the sensors 154 when rotated past, and the other pole facing an inner side of the ring, away from the sensors 154. Magnetic pole pairs of the magnets 160 can be arranged oppositely to one another in the ring, meeting at a ring junction 169 forming a closed loop.

For example, a south pole 166 of the first magnet 160a can be arranged adjacently to a north pole 164 of the second magnet 160b; the north pole 164 of the second magnet 160b can be arranged adjacently to a south pole 166 of the third magnet 160c; the south pole 166 of the third magnet 160c can be arranged adjacently to a north pole 164 of the fourth magnet 160d; the north pole 164 of the fourth magnet 160d can be arranged adjacently to a south pole 166 of the fifth magnet 160e; and the south pole 166 of the fifth magnet 160e can be arranged adjacently to a north pole 164 of the sixth magnet 160, each of the aforementioned poles facing an outer side of the ring. Also, a north pole 164 of the first magnet 160a can be arranged adjacently to a south pole 166 of the second magnet 160b; the south pole 166 of the second magnet 160b can be arranged adjacently to a north pole 164 of the third magnet 160c; the north pole 164 of the third magnet 160c can be arranged adjacently to a south pole 166 of the fourth magnet 160d; the south pole 166 of the fourth magnet 160d can be arranged adjacently to a north pole 164 of the fifth magnet 160e; and the north pole 164 of the fifth magnet 160e can be arranged adjacently to a south pole 166 of the sixth magnet 160f, each of the aforementioned poles facing an inner side of the ring.

The encoder scale 152 and the sensors 154 are configured to move with respect to one another in a rotary direction of travel, such as the encoder scale 152 rotating clockwise or counter-clockwise. The sensors 154 can be magnetic field sensors configured to detect magnetic fields produced from the encoder scale 152 based on the configuration of the encoder scale 152 that is proximal to the sensors 154 across the gap 146. In addition, each sensor 154 can be configured to indicate a magnetic field direction produced from the encoder scale 152. The sensors 154 could comprise, for example, AMR sensors, TMR sensors and/or Hall effect sensors. The sensors 154 can be arranged on a PCB with sensing elements of the sensors 154 arranged perpendicularly to the PCB and the encoder scale 152.

In accordance with an aspect of the invention, the magnets 160 (including the magnetic pole pairs of each) of the encoder scale 152 can successively increase or decrease in size (or pitch) in the ring with a first magnet of the multiple magnets 160 being largest and a last magnet of the multiple magnets 160 being smallest. For example, the encoder scale 52 could have six magnets in which the first magnet 160a is a largest magnet; the second magnet 160b is successively smaller than the first magnet 160a; the third magnet 160c is successively smaller than the second magnet 160b; the fourth magnet 160d is successively smaller than the third magnet 160c; the fifth magnet 160e is successively smaller than the fourth magnet 160d); and the last, sixth magnet 160f is a smallest magnet. By configuring an encoder scale as a set of oppositely arranged, adjacent magnets 160 with successively increasing or decreasing pitch in a ring, the sensors 154 can detect phase differences to determine absolute positions of the encoder scale 152. In particular, due to the successively increasing or decreasing pitch, each sensor 154 can detect successively increasing or decreasing magnetic fields from the encoder scale 152 in a uniquely identifiable pattern. A control system communicating with the sensors 154, such as the controller 20, can take the difference between readings of adjacent sensors 154 to determine an absolute position of the encoder scale 152. This principle is analogous to a Nonius or Vernier principle to determine absolute position.

Figure 7:
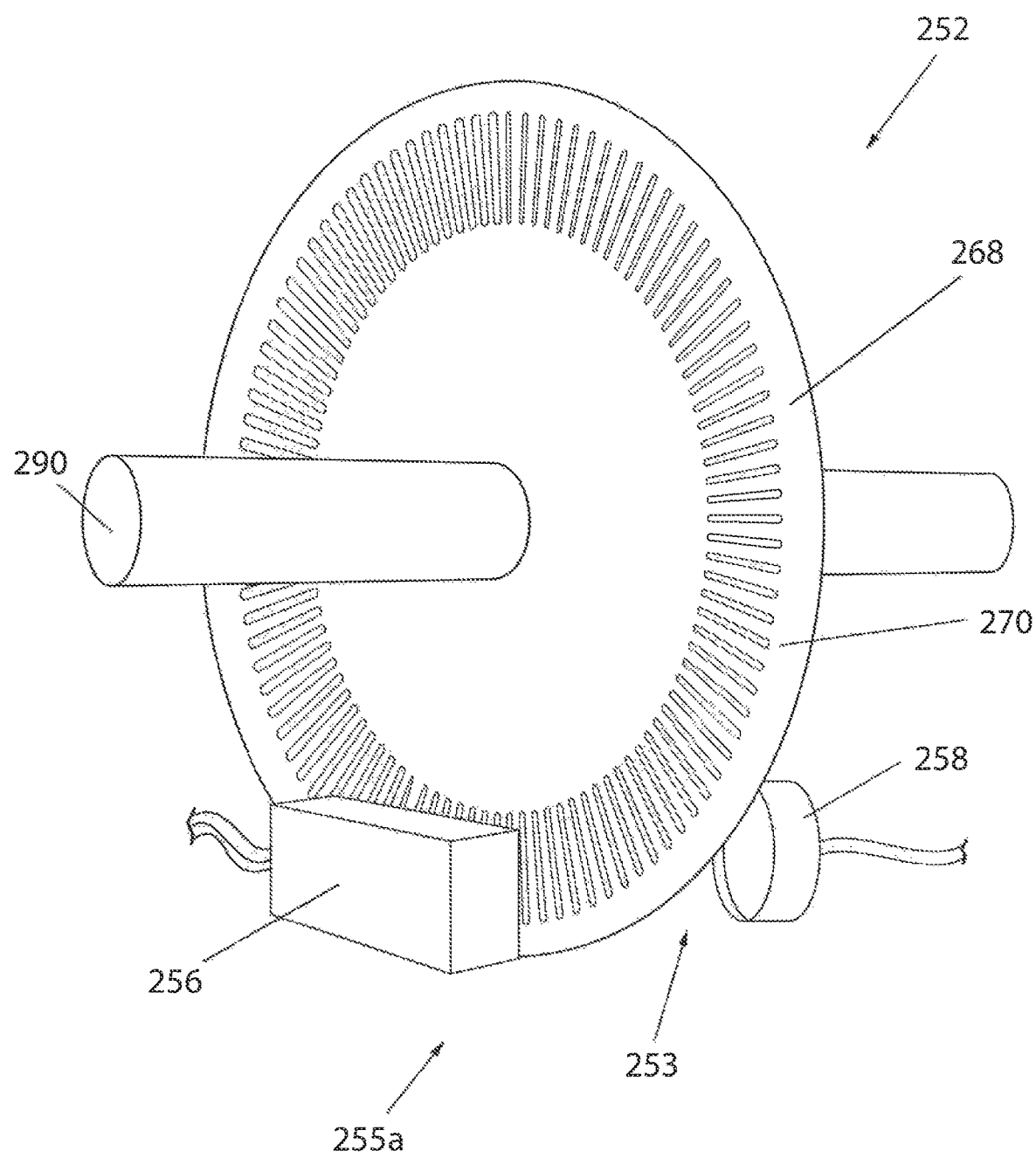
FIG. 7 is an isometric view of an optical rotary encoder system for absolute position determination in accordance with an aspect of the invention.

Referring now to FIG. 7, in another aspect of the invention, an optical encoder system for position determination implementing similar principles can include an optical encoder scale 252 and at least two sensors 255 arranged proximal to the encoder scale. The encoder scale 252 can comprise a disk 268 having multiple holes 270 evenly spaced circumferentially around an interior area. The sensors 255 can be arranged proximal to the encoder scale 252. Each sensor can comprise a photo cell 256 and a light source 258. Each photo cell 256 can be configured to detect light 253 across a gap from the light source 258 through holes 270 in the disk 268. Each photo cell 256 could include one or more photo transistors, photo diodes or the like for capturing light. The encoder scale 252 and the sensors 255 can be configured to move with respect to one another, such as the encoder scale 252 being attached to a rotating portion 290, such as a drive shaft, while the sensors 255 are attached to a stationary portion, arranged proximal to the encoder scale 252 across a gap, which could be an air gap. The holes 270 of the encoder scale 252 successively increase or decrease in size with a first hole 270a being largest and a last hole 270b being smallest and with the first hole 270a being arranged adjacently to the last hole 270b in the interior area. The holes 270 of the encoder scale 252 can successively increase or decrease in size by a factor of two to one (2:1) from the first hole to the last hole.

Certain terminology is used herein for purposes of reference only, and thus is not intended to be limiting. For example, terms such as "upper," "lower," "above," and "below" refer to directions in the drawings to which reference is made. Terms such as "front," "back," "rear," "bottom," "side," "left" and "right" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as coming within the scope of the following claims. All of the publications described herein including patents and non-patent publications are hereby incorporated herein by reference in their entireties.

What is claimed is:

1. An encoder system for position determination, comprising:
   an encoder scale having a plurality of magnets arranged adjacently to one another, wherein a magnetic pole pair comprising a north pole and a south pole of each magnet is arranged oppositely to a magnetic pole pair comprising a north pole and a south pole of an adjacent magnet so that the north pole of a magnet is adjacent to the south pole of a neighboring magnet and the south pole of the magnet is adjacent to the north pole of the neighboring magnet; and
   a plurality of sensors arranged along a path, each sensor being configured to detect a magnetic field produced from the encoder scale across a gap when the encoder scale is proximal to the sensor,
   wherein the encoder scale and the plurality of sensors are configured to move with respect to one another in a direction, and
   wherein magnets of the encoder scale successively increase or decrease in size with a first magnet of the plurality of magnets being largest and a last magnet of the plurality of magnets being smallest.

2. The system of claim 1, wherein the plurality of magnets includes at least six magnets.

3. The system of claim 1, wherein the path is a track having curved sections and linear sections.

4. The system of claim 3, further comprising a cart for moving objects along the track, wherein the encoder scale is attached to the cart.

5. The system of claim 1, wherein the encoder system is an absolute linear encoder.

6. The system of claim 1, wherein the encoder system is an absolute 180 degree rotary encoder.

7. The system of claim 1, further comprising a processor in communication with the plurality of sensors, wherein the processor executes a program stored in a non-transient medium to locate an absolute position of the encoder scale with respect to at least two of the plurality of sensors.

8. The system of claim 7, wherein the processor locates the absolute position of the encoder scale by calculating a phase difference between the at least two of the plurality of sensors.

9. The system of claim 7, wherein the sensors are Anisotropic Magnetoresistance (AMR), Tunnel Magneto Resistance (TMR) or Hall effect sensors mounted to a Printed Circuit Board (PCB).

10. The system of claim 1, wherein the sensors are spaced apart by a fixed distance, and wherein a length of the encoder scale in the direction of the path is at least twice the fixed distance.

11. The system of claim 10, wherein the fixed distance is at least 20 millimeters.

12. The system of claim 11, wherein the first magnet has a length of at least 7 millimeters.

13. The system of claim 12, wherein the last magnet has a length of less than 5 millimeters.

14. A rotary encoder system for position determination, comprising:
    an encoder scale having a plurality of magnets arranged adjacently to one another, wherein a magnetic pole pair comprising a north pole and a south pole of each magnet is arranged oppositely to a magnetic pole pair comprising a north pole and a south pole of an adjacent magnet so that the north pole of a magnet is adjacent to the south pole of a neighboring magnet and the south pole of the magnet is adjacent to the north pole of the neighboring magnet, wherein the plurality of magnets are arranged in a ring; and
    two sensors spaced 180 degrees apart on the ring across a gap, each of the at least two sensors being configured to detect a magnetic field produced from a magnet of the encoder scale across a gap when the magnet is proximal to the sensor,
    wherein the encoder scale and the sensors are configured to move with respect to one another, and
    wherein magnets of the encoder scale successively increase or decrease in size with a first magnet of the plurality of magnets being largest and a last magnet of the plurality of magnets being smallest and with the first magnet being arranged adjacently to the last magnet in the ring.

15. The system of claim 14, wherein the plurality of magnets includes at least six magnets.

16. The system of claim 14, wherein the encoder system is an absolute rotary encoder for 180 degrees.

17. The system of claim 14, further comprising a processor in communication with the sensors, wherein the processor executes a program stored in a non-transient medium to locate an absolute position of the encoder scale with respect to the sensors.

18. The system of claim 17, wherein the processor locates the absolute position of the encoder scale by calculating a phase difference between the sensors.

19. The system of claim 18, wherein the sensors are Anisotropic Magnetoresistance (AMR), Tunnel Magneto Resistance (TMR) or Hall effect sensors mounted to a Printed Circuit Board (PCB).

20. An optical rotary encoder system for position determination, comprising:
    an encoder scale comprising a disk having a plurality of holes evenly spaced circumferentially around an interior area; and
    at least two sensors arranged proximal to the encoder scale, each sensor comprising a photo cell and a light source, wherein each photo cell is configured to detect light across a gap from a light source through a hole in the disk, wherein the encoder scale and the at least two sensors are configured to move with respect to one another, and wherein holes of the encoder scale successively increase or decrease in size with a first hole of the plurality of holes being largest and a last hole of the plurality of holes being smallest and with the first hole being arranged adjacently to the last hole in the interior area.

* * * * *